United States Patent
Lee et al.

(10) Patent No.: US 11,798,624 B2
(45) Date of Patent: Oct. 24, 2023

(54) SEMICONDUCTOR MEMORY AND OPERATING METHOD THEREOF

(71) Applicant: SK hynix Inc., Icheon-si (KR)

(72) Inventors: Dong Uk Lee, Icheon-si (KR); Kyung Min Kim, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 74 days.

(21) Appl. No.: 17/511,323

(22) Filed: Oct. 26, 2021

(65) Prior Publication Data
US 2022/0359013 A1    Nov. 10, 2022

(30) Foreign Application Priority Data
May 4, 2021    (KR) .......................... 10-2021-0057671

(51) Int. Cl.
*G11C 16/04* (2006.01)
*G11C 29/48* (2006.01)

(52) U.S. Cl.
CPC .......... *G11C 16/0483* (2013.01); *G11C 29/48* (2013.01)

(58) Field of Classification Search
None
See application file for complete search history.

(56) References Cited

U.S. PATENT DOCUMENTS 6,830,938 B1 * 12/2004 Rodriguez .............. H01L 28/55
                                                            438/18
9,214,236 B2 * 12/2015 Lue .......................... G11C 16/08

2013/0100743 A1 * 4/2013 Lue ........................ H01L 29/792
                                                            365/185.18
2016/0055910 A1 * 2/2016 Tuers ..................... G11C 29/4401
                                                            365/185.11
2016/0071608 A1 * 3/2016 Bronner .............. G11C 13/0002
                                                            365/185.18

(Continued)

FOREIGN PATENT DOCUMENTS

KR    1020100023284 A    3/2010
KR    1020160108196 A    9/2016
WO    WO-9718481 A1 *   5/1997   ......... G01R 31/3004

(Continued)

OTHER PUBLICATIONS

Chip with micro-hotplate for self-healing and sustainable electronics, Electrical and Electronics, Reference No. TOP2-278, https://technology.nasa.gov/patent/TOP2-278, Retrieval Date: Oct. 1, 2020, National Aeronautics and Space Administration (NASA), USA.

(Continued)

*Primary Examiner* — Guerrier Merant
(74) *Attorney, Agent, or Firm* — WILLIAM PARK & ASSOCIATES LTD.

(57) ABSTRACT

There are provided a semiconductor memory and an operating method thereof. The semiconductor memory includes: a plurality of memory blocks each including a plurality of select transistors and a plurality of memory cells; a peripheral circuit for performing a general operation including a program operation, a read operation, and an erase operation on the plurality of memory blocks; and a control logic for controlling the peripheral circuit to operate in a heating mode in which the peripheral circuit applies heat to the plurality of memory blocks.

20 Claims, 9 Drawing Sheets

(56) References Cited

U.S. PATENT DOCUMENTS

2016/0172044 A1* 6/2016 Lu .................. G11C 16/3431
365/185.11
2016/0240253 A1* 8/2016 Zhou ................ G11C 11/2273

FOREIGN PATENT DOCUMENTS

| WO | WO-2008067494 A1 * | 6/2008 | ......... G11C 13/0002 |
| WO | WO-2011022123 A1 * | 2/2011 | ......... G06F 12/1009 |
| WO | WO-2018071143 A2 * | 4/2018 | ......... G11C 11/2275 |

OTHER PUBLICATIONS

Choong-Ki Kim et al., Electrothermal Annealing (ETA) Method to Enhance the Electrical Performance of Amorphous-Oxide-Semiconductor (AOS) Thin-Film Transistors (TFTs), ACS Applied Materials & Interfaces, www.acsami.org, Aug. 23, 2016, pp. 23820-23826, American Chemical Society, ACS Publications.

Dieter K. Schroder, Semiconductor Material and Device Characterization, Third Edition, 2006, Wiley-IEEE Press, Wiley, New York.

Hang-Ting Lue et al., Radically Extending the Cycling Endurance of Flash Memory (to > 100M Cycles) by Using Built-in Thermal Annealing to Self-heal the Stress-induced Damage, 2012 International Electron Devices Meeting, Dec. 10-13, 2012, IEEE, San Francisco, CA, USA.

Jin-Woo Han et al., System on Microheater for On-Chip Annealing of Defects Generated by Hot-Carrier Injection, Bias Temperature Instability, and Ionizing Radiation, IEEE Electron Device Letters, vol. 37, No. 12, Dec. 2016, pp. 1543-1546.

Jun-Young Park et al., Curing of Hot-Carrier Induced Damage by Gate-Induced Drain Leakage Current in Gate-All-Around FETs, IEEE Electron Device Letter, vol. 40, No. 12, Dec. 2019, pp. 1909-1912.

Renhai Chen et al., Heating Dispersal for Self-Healing NAND Flash Memory, IEEE Transactions on Computers, vol. 66, No. 2, Feb. 2017, pp. 361-367.

Yuh-Te Sung et al., A New Saw-Like Self-Recovery of Interface States in Nitride-Based Memory Cell, 2014 IEEE International Electron Devices Meeting, Dec. 15-17, 2014, pp. 494-497, IEEE, San Francisco, CA, USA.

* cited by examiner

BLK1

SEMICONDUCTOR MEMORY AND OPERATING METHOD THEREOF

CROSS-REFERENCE TO RELATED APPLICATION

The present application claims priority under 35 U.S.C. § 119(a) to Korean patent application number 10-2021-0057671, filed on May 4, 2021, in the Korean Intellectual Property Office, the entire disclosure of which is incorporated herein by reference.

BACKGROUND

1. Technical Field

The present disclosure generally relates to an electronic device, and more particularly, to a semiconductor memory and an operating method thereof.

2. Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a semiconductor memory, i.e., a data storage device. The data storage device is used as a main memory device or an auxiliary memory device of the portable electronic devices.

A data storage device using a semiconductor memory has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

The semiconductor memory is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

The semiconductor memory may be attached to a PCB board by performing an infrared (IR) reflow process after a packaging process. Memory cells included in the semiconductor memory packaged in the reflow process are exposed to high heat (e.g., 200° C. or higher), and hence a threshold voltage distribution of the memory cells may be changed. Therefore, an error may occur in system data that is programmed in the semiconductor memory before the reflow process is performed.

SUMMARY

In accordance with an aspect of the present disclosure, there is provided a semiconductor memory including: a plurality of memory blocks each including a plurality of select transistors and a plurality of memory cells; a peripheral circuit configured to perform a general operation including a program operation, a read operation, and an erase operation on the plurality of memory blocks; and a control logic configured to control the peripheral circuit to operate in a heating mode in which the peripheral circuit applies heat to the plurality of memory blocks.

In accordance with another aspect of the present disclosure, there is provided a semiconductor memory including: a plurality of memory blocks each including a plurality of select transistors and a plurality of memory cells; a peripheral circuit configured to perform a general operation including a program operation, a read operation, and an erase operation on the plurality of memory blocks; and a control logic configured to control the peripheral circuit to operate in a heating mode in which the peripheral circuit applies heat to the plurality of memory blocks before a reflow process, wherein, in the heating mode, the peripheral circuit configured to apply the heat to the plurality of memory blocks through an electro-thermal annealing (ETA) process.

In accordance with still another aspect of the present disclosure, there is provided a method for operating a semiconductor memory, the method including: programming free pattern data in at least one selected memory block, among a plurality of memory blocks; performing a pre-baking operation of applying heat to the plurality of memory blocks through an electro-thermal annealing (ETA) process; programming test pattern data in the at least one selected memory block, and detecting fail bits; and programming system data in a system block, among the plurality of memory blocks, when a number of the detected fail bits is smaller than a set number.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Embodiments provide a semiconductor memory capable of improving data reliability and an operating method of the semiconductor memory.

Figure 1:
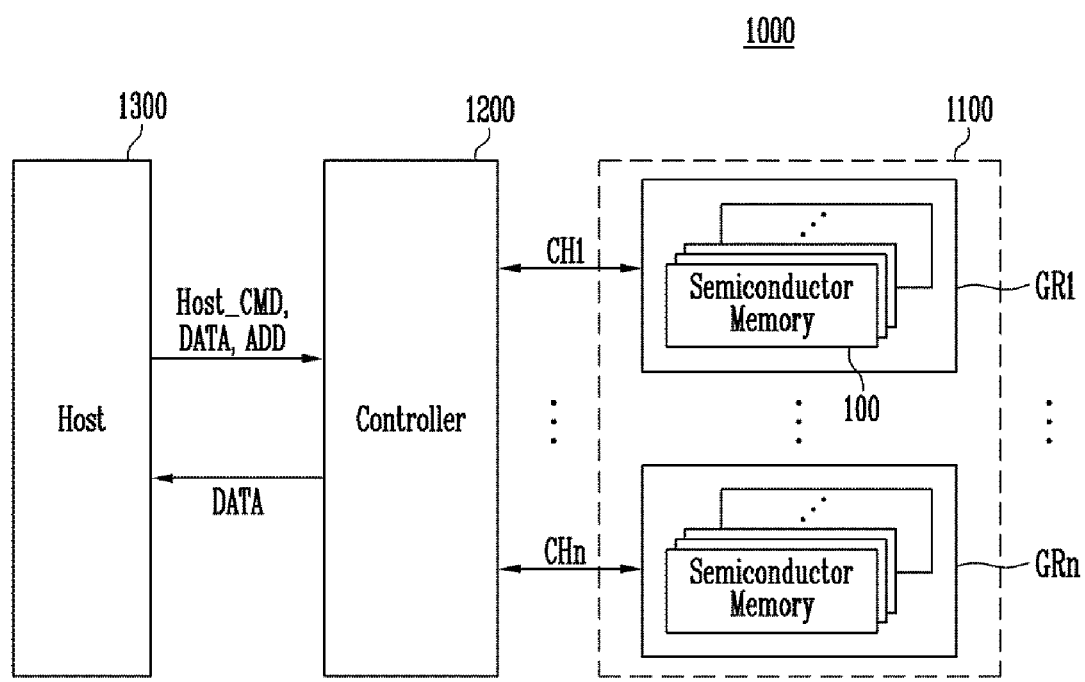
FIG. 1 is a block diagram illustrating a memory system including a semiconductor memory in accordance with an embodiment of the present disclosure.

FIG. 1 is a block diagram illustrating a memory system including a semiconductor memory in accordance with an embodiment of the present disclosure.

Referring to FIG. 1, the memory system 1000 may include a memory device 1100, a controller 1200, and a host 1300. The memory device 1100 may include a plurality of semiconductor memories 100. The plurality of semiconductor memories 100 may be divided into a plurality of groups GR1 to GRn. Although the case in which the host 1300 is included in the memory system 1000 is illustrated and described in the embodiment of the present disclosure, the memory system 1000 may include only the controller 1200 and the memory device 1100, and the host 1300 may be disposed outside of the memory system 1000.

In FIG. 1, it is illustrated that the plurality of groups GR1 to GRn of the memory device 1100 communicate with the controller 1200, respectively, through first to nth channels CH1 to CHn. Each semiconductor memory 100 will be described later with reference to FIG. 2.

Each of the plurality of groups GR1 to GRn may communicate with the controller 1200 through one common channel. The controller 1200 may control the plurality of semiconductor memories 100 of the memory device 1100 through the plurality of channels CH1 to CHn.

The semiconductor memory 100 may be attached to a PCB board by performing a reflow process in an assembling process. System data with firmware data may be stored in the semiconductor memory 100 before the semiconductor memory 100 is attached to the PCB substrate.

The semiconductor memory 100, in accordance with the embodiment of the present disclosure, may operate in a heating mode before an operation of storing system data. The semiconductor memory 100 may discharge charges that are unstably trapped in a memory layer of memory cells and ions that are introduced in a manufacturing process by applying heat to the memory cells in the heating mode. Accordingly, a threshold voltage characteristic of the memory cells can be improved.

The semiconductor memory 100 may apply heat through an electro-thermal annealing (ETA) process in the heating mode. For example, in the heating mode, the semiconductor memory 100 may operate through a Gate Induced Drain Leakage (GIDL) process in which heat is generated by generating a GIDL current in a drain select transistor or a source select transistor, which is included in the memory block, or through a Hot Carrier Injection (HCI) process in which heat is applied by generating hot carriers in a lower channel of the drain select transistor or the source select transistor.

The controller 1200 may be connected between the host 1300 and the memory device 1100. The controller 1200 may access the memory device 1100 in response to a request from the host 1300. For example, the controller 1200 may control read, program, erase, and background operations of the memory device 1100 in response to a host command Host_CMD received from the host 1300. In a program operation, the host 1300 may transmit an address ADD and data DATA to be programmed together with the host command Host_CMD. In a read operation, the host 1300 may transmit an address ADD together with the host command Host_CMD. In a program operation, the controller 1200 may transmit a command that corresponds to the program operation and data DATA to be programmed to the memory device 1100. In a read operation, the controller 1200 may transmit a command that corresponds to the read operation to the memory device 1100, receive read data DATA from the memory device 1100, and transmit the received data DATA to the host 1300. The controller 1200 may provide an interface between the memory device 1100 and the host 1300. The controller 1200 may drive firmware for controlling the memory device 1100.

The host 1300 may include portable electronic devices such as a computer, a PDA, a PMP, an MP3 player, a camera, a camcorder, and a mobile phone. The host 1300 may request a program operation, a read operation, an erase operation, etc. of the memory system 1000 through a host command Host_CMD. For the purpose of a program operation, the host 1300 may transmit a host command Host CMD that corresponds to the program operation, data DATA, and an address ADD to the controller 1200. For the purpose of a read operation, the host 1300 may transmit a host command Host_CMD that corresponds to the read operation and an address ADD to the controller 1200.

The controller 1200 and the memory device 1100 may be integrated into one semiconductor memory. In an exemplary embodiment, the controller 1200 and the memory device 1100 may be integrated into one semiconductor memory to constitute a memory card. For example, the controller 1200 and the memory device 1100 may be integrated into one semiconductor memory to constitute a memory card, such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device that is capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1100 or the memory system 1000 may be packaged in various forms. For example, the memory device 1100 or the memory system 1000 may be packaged in a manner, such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
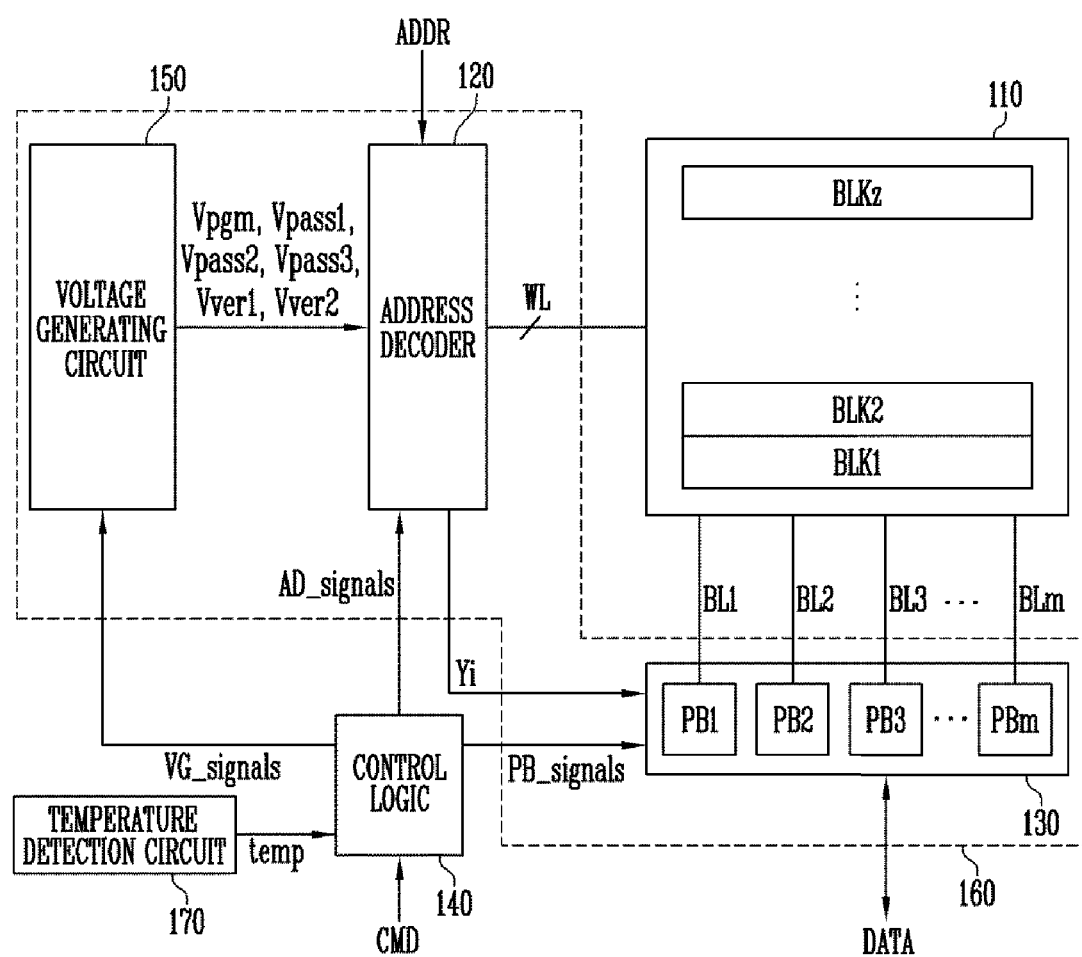
FIG. 2 is a diagram illustrating the semiconductor memory shown in FIG. 1.

FIG. 2 is a diagram illustrating the semiconductor memory shown in FIG. 1.

Referring to FIG. 2, the semiconductor memory 100 may include a memory cell array 110, an address decoder 120, a read/write circuit 130, a control logic 140, a voltage generating circuit 150, and a temperature detection circuit 170. The address decoder 120, the read/write circuit 130, and the voltage generating circuit 150 may be defined as a peripheral circuit 160 that performs a program operation on the memory cell array 110.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read/write circuit 130 through bit lines BL1 to BLm. Each of the plurality of memory blocks BLK1 to BLKz may include a plurality of memory cells. In an embodiment, the plurality of memory cells may be nonvolatile memory cells. At least one memory block, among the plurality of memory blocks BLK1 to BLKz, may be a system block, and system data with firmware data may be stored in the system block.

Each of the plurality of memory blocks BLK1 to BLKz of the memory cell array 110 may include a plurality of memory strings. Each of the plurality of memory strings may include a drain select transistor, a plurality of memory cells, and a source select transistor, which are connected in series between a bit line and a source line. Also, each of the plurality of memory strings may include a pass transistor between the source select transistor and the memory cells and a pass transistor between the drain select transistor and the memory cells, and each of the plurality of memory strings may further include a pipe gate transistor between the memory cells. The memory cell array 110 will be described in detail later.

The address decoder 120 may be connected to the memory cell array 110 through the word lines WL. The address decoder 120 may operate in response to address decoder control signals AD_signals that are generated by the control logic 140. The address decoder 120 may receive an address ADDR through an input/output buffer (not shown) in the semiconductor memory 100.

The address decoder 120 may decode a row address in the received address ADDR, and may apply, to a plurality of memory cells of the memory cell array 110, a plurality of operation voltages including a program voltage Vpgm, a pass voltage Vpass1 to Vpass3, and verify voltages Vver1 and Vver2, which are generated by the voltage generating circuit 150 during the program operation, according to the decoded row address.

The address decoder 120 may decode a column address in the received address ADDR. The address decoder 120 transmits the decoded column address Yi to the read/write circuit 130.

An address ADDR received in the program operation may include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be connected to the memory cell array 110 through the bit lines BL1 to BLm. In a program operation, each of the plurality of page buffer PB1 to PBm may temporarily store program data DATA that is received from the controller 1200, shown in FIG. 1, and may control potential levels of the bit lines BL1 to BLm according to the temporarily stored data DATA.

The read/write circuit 130 may sense a current or a voltage of the bit lines BL1 to BLm in a verify operation during the program operation and may store the sensing result as verify data.

The read/write circuit 130 may operate in response to page buffer control signals PB_signals that are output from the control logic 140.

In an exemplary embodiment, the read/write circuit 130 may include page buffers (or page registers), a column select circuit, and the like.

The control logic 140 may be connected to the address decoder 120, the read/write circuit 130, and the voltage generating circuit 150. The control logic 140 may receive a command CMD through the input/output buffer (not shown) of the semiconductor memory 100. The control logic 140 may control a general operation of the semiconductor memory 100 in response to the command CMD. For example, the control logic 140 may receive a command CMD that corresponds to a program command and may generate and output address decoder control signals AD_signals for controlling the address decoder 120, page buffer control signals PB_signals for controlling the read/write circuit 130, and voltage generating circuit control signals VG_signals for controlling the voltage generating circuit 150 in response to a received command CMD.

The control logic 140, in accordance with the embodiment of the present disclosure, may control the peripheral circuit 160 to operate in a heating mode before a reflow process is performed. For example, the control logic 140 may control the peripheral circuit 160 to operate in the heating mode before a system data program operation and the reflow process are performed. The control logic 140 may control the peripheral circuit 160 to apply heat to the plurality of memory blocks BLK1 to BLKz through an ETA process in the heating mode. For example, the control logic 140 may control the peripheral circuit 160 to generate heat in drain select transistors or source select transistors, which are included in the plurality of memory blocks BLK1 to BLKz, or on the bottom of the drain select transistors and the source select transistors through a GIDL process or an HCI process.

Also, the control logic 140 may end the heating mode, when the internal temperature of the semiconductor memory 100 exceeds a set temperature, based on a temperature signal temp received from the temperature detection circuit 170.

The voltage generating circuit 150 may generate a program voltage Vpgm, a plurality of pass voltages Vpass1, Vpass2, and Vpass3, and a plurality of verify voltages Vver1 and Vver2 based on the voltage generating circuit control signals VG_signals that are output from the control logic 140 in a program operation and may output the generated voltages to the address decoder 120.

The temperature detection circuit 170 may detect an internal temperature of the semiconductor memory 100 and may output a temperature signal temp that corresponds to the detected temperature to the control logic 140. The temperature detection circuit 170 may be included in the control logic 140.

Figure 3:
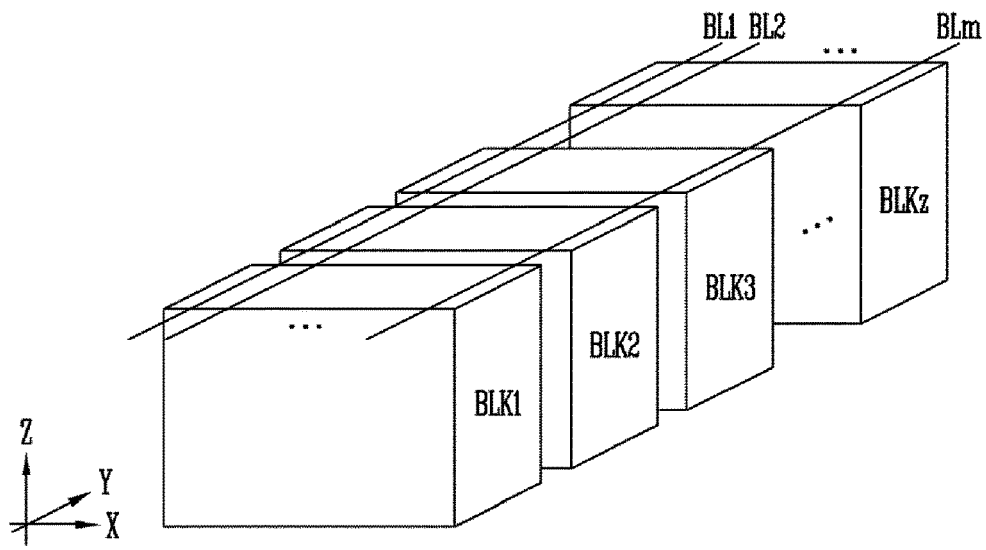
FIG. 3 is a diagram illustrating three-dimensionally configured memory blocks.

FIG. 3 is a diagram illustrating three-dimensionally configured memory blocks.

Referring to FIG. 3, the three-dimensionally configured memory blocks BLK1 to BLKz may be arranged to be spaced apart from each other along a direction Y in which bit lines BL1 to BLm extend. For example, first to zth memory blocks BLK1 to BLKz may be arranged to be spaced apart from each other along a second direction Y and may include a plurality of memory cells that are stacked along a third direction Z. A configuration of any one memory block, among the first to zth memory blocks BLK1 to BLKz, will be described in detail with reference to FIGS. 4 and 5.

Figure 4:
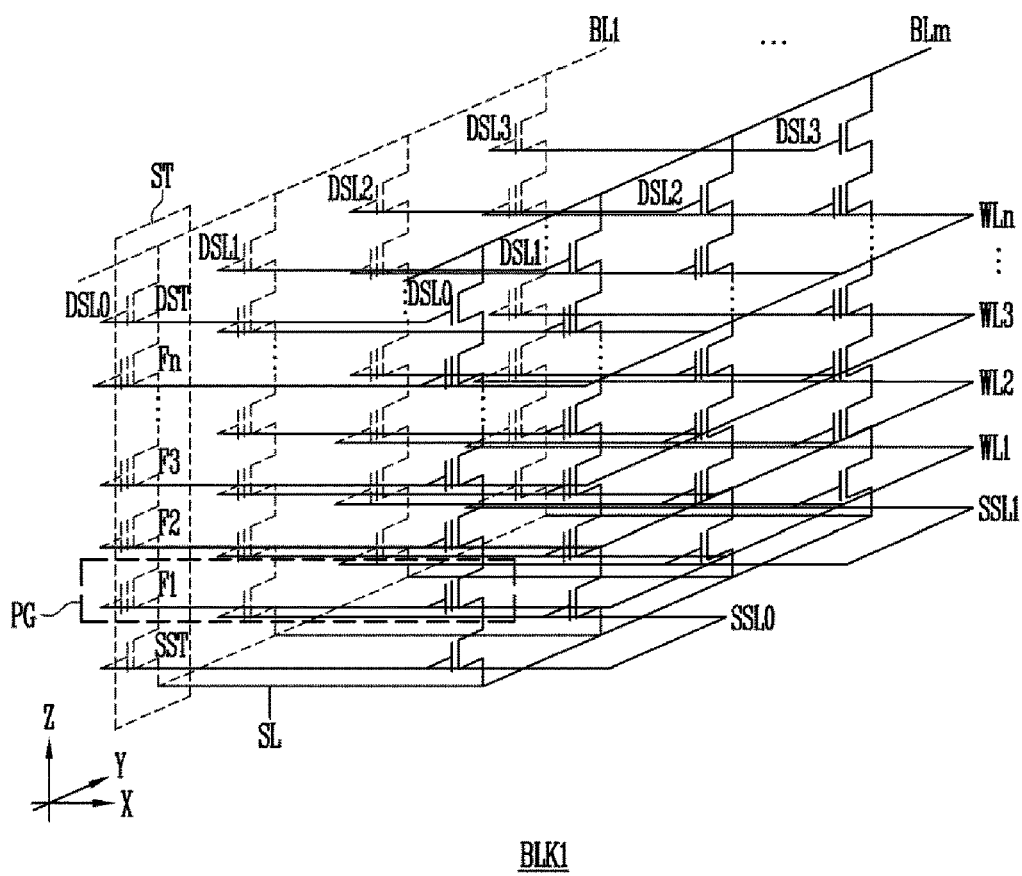
FIG. 4 is a circuit diagram illustrating in detail any one memory block shown in FIG. 3.

FIG. 4 is a circuit diagram illustrating in detail any one memory block shown in FIG. 3.

Referring to FIG. 4, a memory block BLK1 may include a plurality of memory strings ST. Each memory string ST may be connected between a corresponding bit line, among bit lines BL1 to BLm, and a source line SL. A memory string ST that is connected between a first bit line BL1 and the source line SL will be described as an example.

The memory string ST may include a source select transistor SST, memory cells F1 to Fn (n is a positive integer), and a drain select transistor DST, which are connected in series between the source line SL and the first bit line BL1. The gates of source select transistors SST that are included in different memory strings ST that are connected to different bit lines BL1 to BLm may be connected to a first source select line SSL0 and may be connected to a second source select line SSL1. In an example, source select transistors that are adjacent to each other in the second direction Y, among the source select transistors SST, may be connected to the same source select line. For example, when assuming that source select transistors SST are sequentially arranged along the second direction Y, the gates of source select transistors SST that are arranged in a first direction X from a first source select transistor SST and are included in different memory strings ST and the gates of source select transistors SST that are arranged in the first direction X from a second source select transistor SST and are included in different memory strings ST may be connected to the first source select line SSL0. In addition, the gates of source select transistors SST that are arranged in the first direction X from a third source select transistor SST and are included in different memory strings ST and the gates of source select transistors SST that are arranged in the first direction X from a fourth source select transistor SST and are included in different memory strings ST may be connected to the second source select line SSL1.

The gates of the memory cells F1 to Fn may be connected to word lines WL1 to WLn, and the gates of drain select transistors DST may be connected to any one of first to fourth drain select lines DSL0 to DSL3.

The gates of transistors that are arranged in the first direction X, among the drain select transistors DST, may be commonly connected to the same drain select line (e.g., DSL0), but the transistors that are arranged in the second direction Y may be connected to different drain select lines DSL1 to DSL3. For example, when assuming that drain select transistors DST are sequentially arranged along the second direction Y, the gates of drain select transistors DST that are arranged in the first direction X from a first drain select transistor DST and included in different memory strings ST may be connected to the first drain select line DSL0. The drain select transistors DST that are arranged in the second direction Y from the drain select transistors DST that are connected to the first drain select line DSL0 may be sequentially connected to the second to fourth drain select lines DSL1 to DSL3. Therefore, in a selected memory block, the memory strings ST that are connected to a selected drain select line may be selected, and the memory strings ST that are connected to the other unselected drain selected lines may be unselected.

The memory cells that are connected to the same word line may constitute one page PG. The page may mean a physical page. For example, a group of memory cells that is connected in the first direction X on the same word line, among the memory strings ST that are connected to the first bit line BL1 to an mth bit line BLm, may be referred to as a page PG. For example, the memory cells that are arranged in the first direction X, among first memory cells F1 that are connected to a first word line WL1, may constitute one page PG. The memory cells that are arranged in the second direction Y, among the first memory cells F1 that are commonly connected to the first word line WL1, may constitute different pages. In FIG. 4, four memory strings may be connected to one bit line (e.g., BL1), and hence, four pages may be connected to one word line. When the first drain select line DSL0 is a selected drain line and the first word line WL1 is a selected word line, a first page that is connected to the first drain select line DSL0, among four pages PG that are connected to the first word line WL1, may become a selected page. Second to fourth pages that are commonly connected to the first word line WL1, but are connected to the unselected second and fourth drain select lines DSL1 to DSL3, may become unselected pages.

Figure 5:
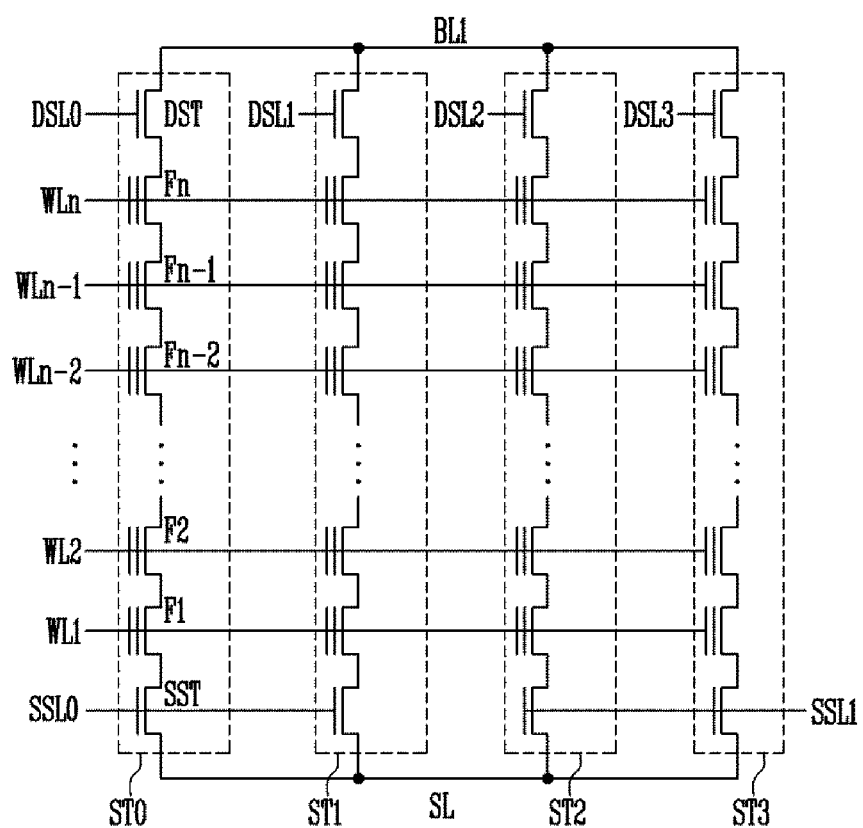
FIG. 5 is a circuit diagram illustrating memory strings shown in FIG. 4.

FIG. 5 is a circuit diagram illustrating memory strings shown in FIG. 4.

Referring to FIG. 5, a plurality of memory strings ST0 to ST3 may be connected between the bit line BL1 and the source line SL. In the embodiment of the present disclosure, for convenience of description, first to fourth memory cells ST0 to ST3 are illustrated and described, but the present disclosure is not limited thereto.

Each of the memory strings ST0 to ST3 may include a source select transistor SST, memory cells F1 to Fn (n is a positive integer), and a drain select transistor DST, which are connected in series to each other between the source line SL and the first bit line BL1. A gate of a drain select transistor DST of the first memory string ST0 may be connected to the first drain select line DSL0, a gate of a drain select transistor DST of the second memory string ST1 may be connected to the second drain select line DSL1, a gate of a drain select transistor DST of the third memory string ST2 may be connected to the third drain select line DSL2, and a gate of a drain select transistor DST of the fourth memory string ST3 may be connected to the fourth drain select line DSL3. In addition, gates of source select transistors SST of the first and second memory strings ST0 to ST1 may be connected to the first source select line SSL0, and gates of source select transistors SST of the third and fourth memory strings ST2 and ST3 may be connected to the second source select line SSL1.

Although the case in which one source select transistor SST and one drain select transistor DST are included in one memory string ST is illustrated in the drawings, a plurality of source select transistors SST and a plurality of drain select transistors DST may be included in one string ST according to the semiconductor memory. In addition, dummy cells may be included between the source select transistor SST, the memory cells F1 to Fn, and the drain select transistor DST according to the semiconductor memory. The dummy cells might not store user data, like normal memory cells F1 to Fn, but may be used to improve electrical characteristics of each memory string ST. However, the dummy cells might not be important components in this embodiment, and therefore, their detailed descriptions will be omitted.

Figure 6:
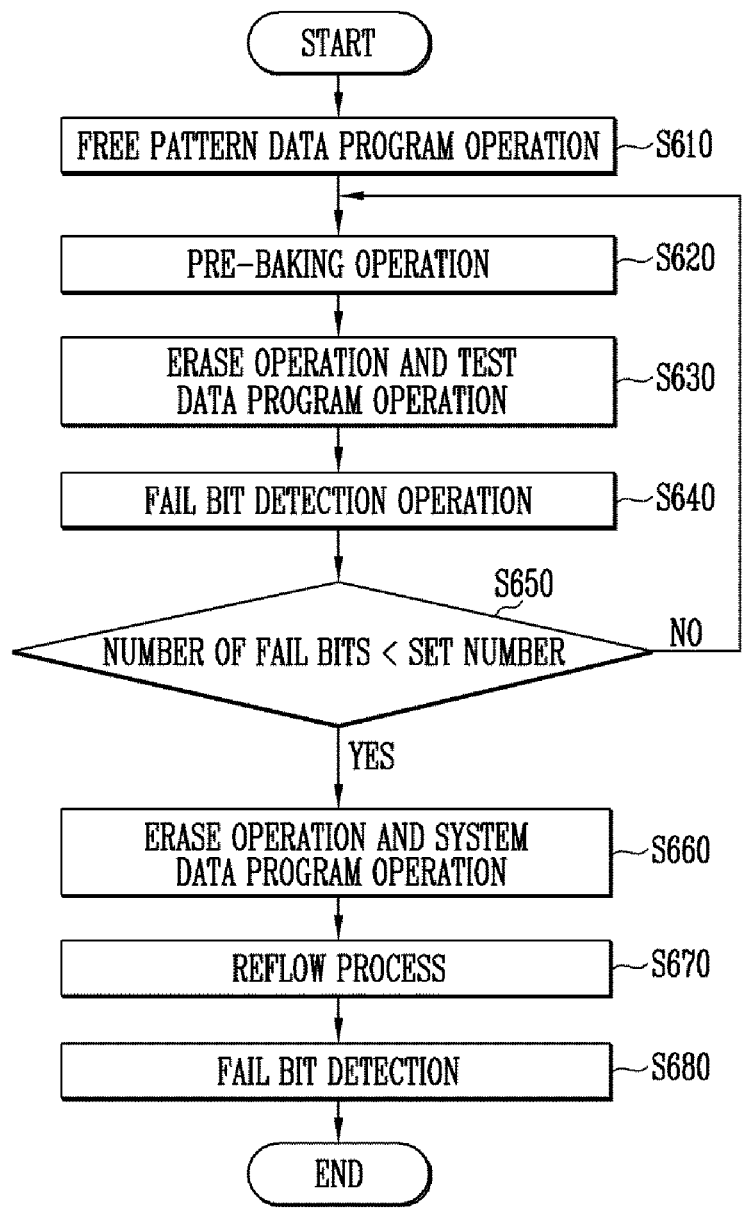
FIG. 6 is a diagram illustrating an operating method of the semiconductor memory in accordance with an embodiment of the present disclosure.

FIG. 6 is a diagram illustrating an operating method of the semiconductor memory in accordance with an embodiment of the present disclosure.

Figure 7:
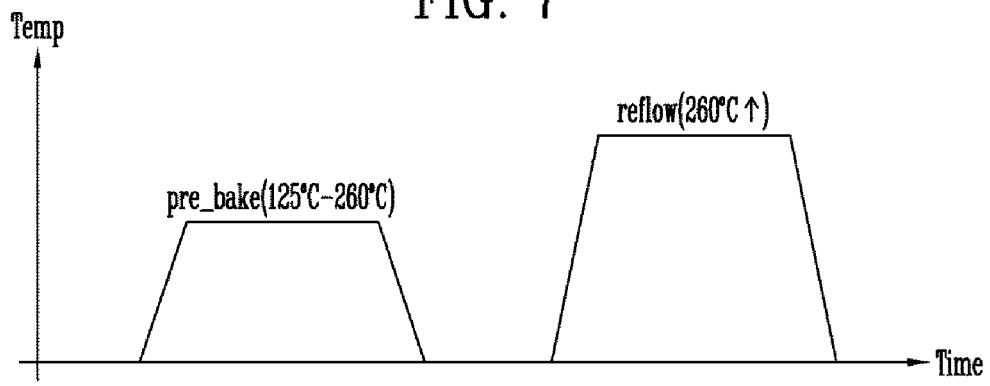
FIG. 7 is a graph illustrating internal temperature of the semiconductor memory in a pre-baking operation and a reflow process.

FIG. 7 is a graph illustrating internal temperature of the semiconductor memory in a pre-baking operation a reflow process.

The operating method of the semiconductor memory in accordance with the embodiment of the present disclosure will be described as follows with reference to FIGS. 2 to 7.

In step S610, the semiconductor memory 100 may perform a free pattern data program operation. First, the semiconductor memory 100, before the semiconductor memory 100 is attached to a PCB board, is provided. The semiconductor memory 100 may be in a state in which processes to a package process have been performed. The control logic 140 of the semiconductor memory 100 may control the peripheral circuit 160 to program free pattern data in at least one selected memory block, among a plurality of memory blocks BLK1 to BLKz. The free pattern data may be random data, dummy data, or erase data.

The peripheral circuit 160 may program the free pattern data in the at least one memory block.

In step S620, the control logic 140 may control the peripheral circuit 160 to perform a pre-baking operation. The control logic 140 may control the peripheral circuit 160 to operate in a heating mode after the semiconductor memory 100 completes the free pattern data program operation. For example, the control logic 140 may control the peripheral circuit 160 to apply heat to the plurality of memory blocks BLK1 to BLKz through an ETA process. For example, the control logic 140 may control the peripheral circuit 160 to generate heat in drain select transistors or source select transistors, which are included in the plurality of memory blocks BLK1 to BLKz, or on the bottom of the drain select transistors and the source select transistors through a GIDL process or an HCI process.

Also, the control logic 140 may determine an internal temperature of the semiconductor memory 100 based on a temperature signal temp that is received from the temperature detection circuit 170, and end the heating mode when the determined internal temperature of the semiconductor memory 100 is higher than a set temperature range. The set temperature range may be 125° C. to 260° C. For example, the control logic 140 may end the heating mode when the internal temperature of the semiconductor memory 100 exceeds 260° C.

In step S630, an erase operation may be performed on the memory block in which the free pattern data is programmed. Subsequently, a test data program operation may be performed.

In the test data program operation, the peripheral circuit 160 may program random data or dummy data in the at least one selected memory block based on the control logic 140.

In step S640, the control logic 140 may control the peripheral circuit 160 to perform a read operation on a memory block in which test data is programmed and may detect fail bits that are included in read data.

In step S650, the control logic 140 may count the number of detected fail bits and may determine whether the counted number of the fail bits is smaller than a set number or is equal to or greater than the set number. When the number of detected fail bits is equal to or greater than the set number, the semiconductor memory 100 may re-perform the above-described steps from the step S620.

When the number of detected fail bits is smaller than the set number in the above-described step 650, in step S660, the semiconductor memory 100 may perform an erase operation on the memory block in which the test data is programmed. Subsequently, the semiconductor memory 100 may perform a system data program operation.

In the system data program operation, the peripheral circuit 160 may program system data in a memory block that is defined as a system block, among the plurality of memory blocks BLK1 to BLKz, based on the control logic 140.

Subsequently, in step S670, a reflow process for attaching the semiconductor memory 100 to the PCB board is performed. The reflow process may be performed at a temperature (e.g., exceeding 260° C.) higher than the set temperature range in the above-described pre-baking operation.

In step S680, the semiconductor memory 100 may perform a fail bit detection operation on the system block after the reflow process is performed. The fail bit detection operation may be performed in a manner that reads system data that is stored in the system block and then detects the number of fail bits that are included in the system data.

Figure 8:
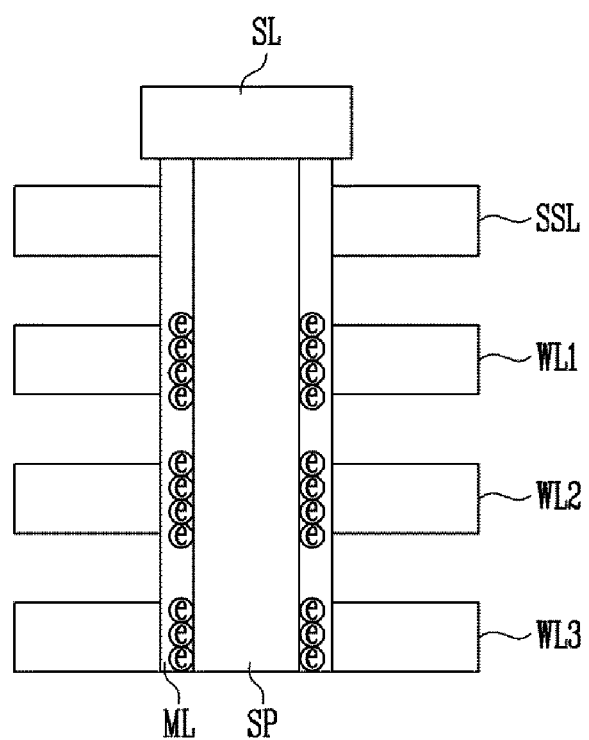
FIG. 8 is a diagram illustrating charges trapped in a memory layer of memory cells in a free pattern data program operation of step S610 shown in FIG. 6.

FIG. 8 is a diagram illustrating charges trapped in a memory layer of memory cells in the free pattern data program operation of the step S610 shown in FIG. 6.

When the free pattern data program operation on the selected memory block in the step S610, shown in FIG. 6, is performed, charges (e) from a vertical channel layer SP may be introduced and trapped in a memory layer ML of memory cells that are included in the selected memory block. Some charges (e), among the charges (e), may be trapped in a shallow trap site of the memory layer ML, and the charges that are trapped in the shallow trap site may be in a relatively unstable state.

In addition, in a manufacturing process of the semiconductor memory, an impurity, e.g., mobile ions, may be introduced into the memory layer ML. The mobile ions may be concentrated on a certain region in the memory layer ML, and therefore, threshold voltage distribution characteristics of the memory cells may be deteriorated.

Figure 9:
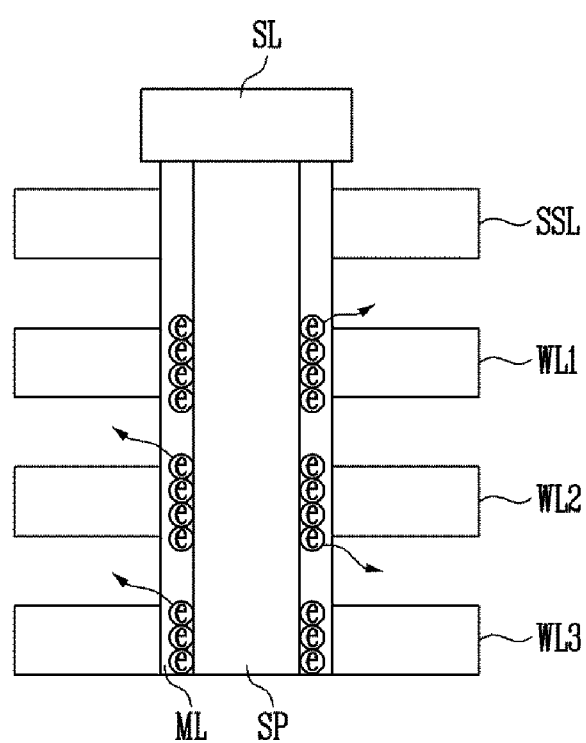
FIG. 9 is a diagram illustrating charges trapped in the memory layer of the memory cells in a pre-baking operation of step S620 shown in FIG. 6.

FIG. 9 is a diagram illustrating charges that are trapped in the memory layer of the memory cells in the pre-baking operation of the step S620, shown in FIG. 6.

Referring to FIG. 9, when heat of 125° C. to 260° C. is applied by performing the pre-baking operation, charges (e)

that are trapped in an unstable state in the shallow trap site of the memory layer ML may be discharged outside of the memory layer ML.

In addition, mobile ions that are introduced into the memory layer ML may be uniformly distributed in the memory layer ML or may be discharged to the outside due to heat.

Accordingly, threshold voltage distribution characteristics of the memory cells can be improved.

Charges in an unstable state may be discharged by performing the pre-baking process, and mobile ions that are introduced into the memory layer ML may be uniformly rearranged or may be discharged outside of the memory layer ML, so that problems can be minimized, in that a threshold voltage distribution is changed due to the heat that is generated during the reflow process even though the reflow process is performed after the system data is programmed.

Figure 10:
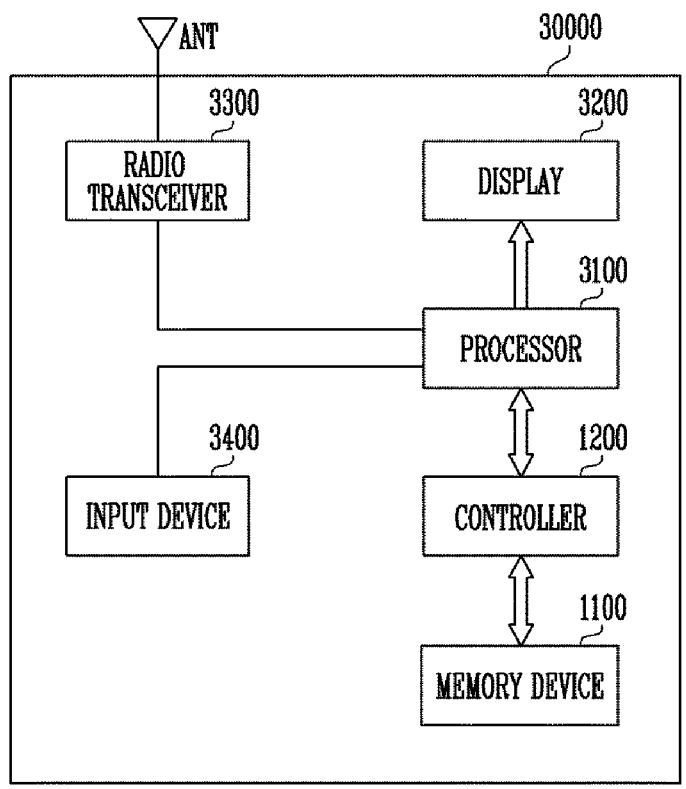
FIG. 10 is a diagram illustrating another embodiment of the memory system.

FIG. 10 is a diagram illustrating another embodiment of the memory system.

Referring to FIG. 10, the memory system 30000 may be implemented as a cellular phone, a smart phone, a tablet PC, a personal digital assistant (PDA), or a wireless communication device. The memory system 30000 may include a memory device 1100 and a controller 1200 that is capable of controlling an operation of the memory device 1100. The controller 1200 may control a data access operation of the memory device 1100, e.g., a program operation, an erase operation, a read operation, or the like based on a processor 3100.

Data that is programmed in the memory device 1100 may be output through a display 3200 based on the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device that is capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 that is capable of controlling an operation of the memory device 1100 may be implemented as a part of the processor 3100, or be implemented as a chip separate from the processor 3100. Also, the controller 1200 may be implemented as an example of the controller 1200 shown in FIG. 1.

Figure 11:
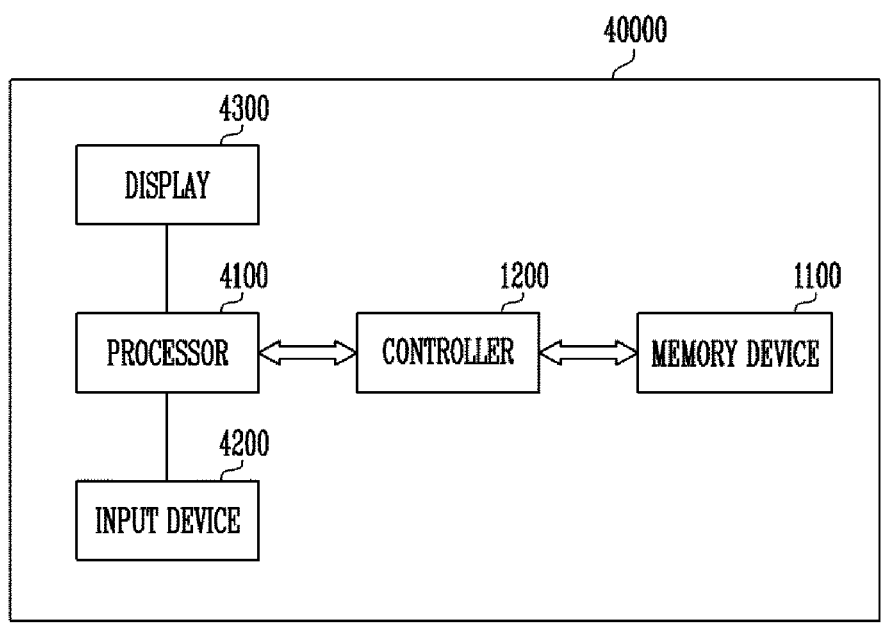
FIG. 11 is a diagram illustrating another embodiment of the memory system.

FIG. 11 is a diagram illustrating another embodiment of the memory system.

Referring to FIG. 11, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 that is capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 1200. In some embodiments, the controller 1200 that is capable of controlling an operation of the memory device 1100 may be implemented as a part of the processor 4100, or be implemented as a chip separate from the processor 4100. Also, the controller 1200 may be implemented as an example of the controller 1200 shown in FIG. 1.

Figure 12:
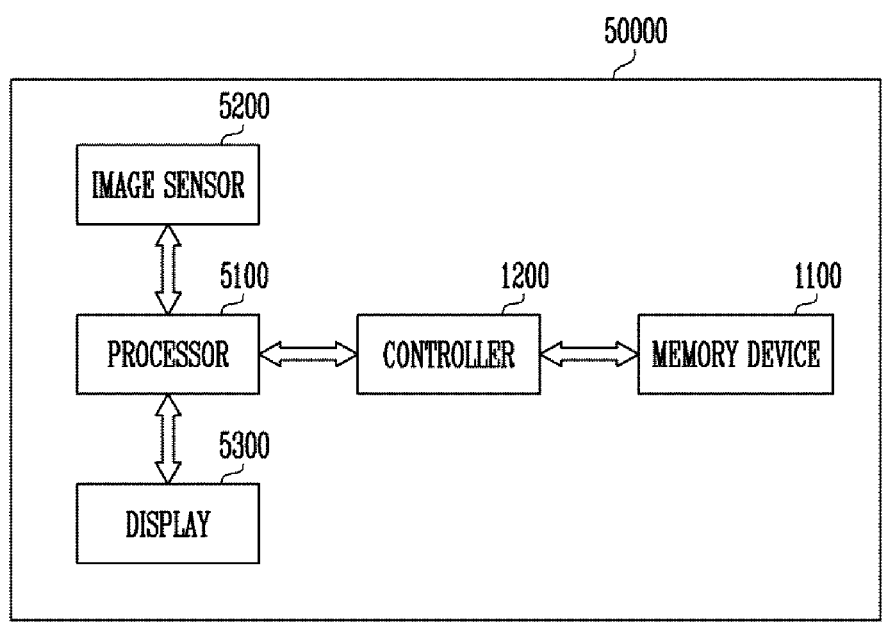
FIG. 12 is a diagram illustrating another embodiment of the memory system.

FIG. 12 is a diagram illustrating another embodiment of the memory system.

Referring to FIG. 12, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 that is capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Based on the processor 5100, the converted digital signals may be output through a display 5300, or be stored in the memory device 1100 through the controller 1200. In addition, data stored in the memory device 1100 may be output through the display 5300 based on the processor 5100 or the controller 1200.

In some embodiments, the controller 1200 that is capable of controlling an operation of the memory device 1100 may be implemented as a part of the processor 5100, or be implemented as a chip separate from the processor 5100. Also, the controller 1200 may be implemented as an example of the controller shown in FIG. 1.

Figure 13:
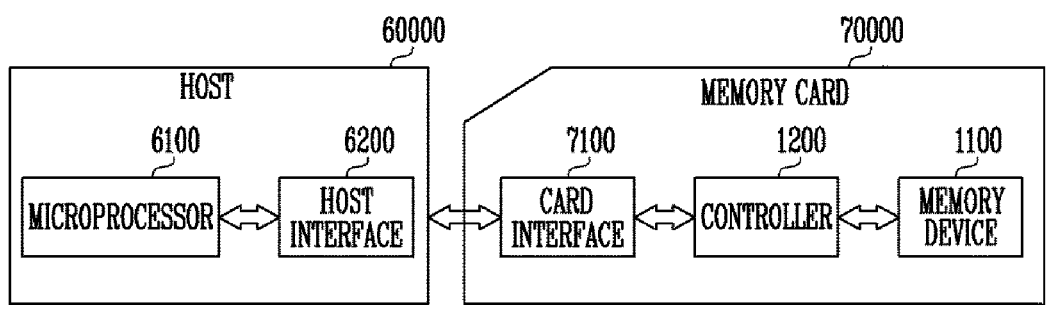
FIG. 13 is a diagram illustrating another embodiment of the memory system.

FIG. 13 is a diagram illustrating another embodiment of the memory system.

Referring to FIG. 13, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the controller 1200 may be implemented as an example of the controller 1200 shown in FIG. 1.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware that is capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 based on a microprocessor 6100.

In accordance with the present disclosure, a pre-baking operation is performed by generating heat in a semiconductor memory before a reflow process through which the semiconductor memory is attached to a PCB board, so that threshold voltage distribution characteristics of memory cells can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory comprising:
   a plurality of memory blocks each including a plurality of select transistors and a plurality of memory cells;
   a peripheral circuit configured to perform a general operation including a program operation, a read operation, and an erase operation on the plurality of memory blocks or to perform a test program and perform a fail bit detection operation on the plurality of memory blocks; and
   a control logic configured to control the peripheral circuit to operate in a heating mode in which the peripheral circuit applies heat to the plurality of memory blocks,
   wherein the control logic is configured to control the peripheral circuit to program system data in a system block, among the plurality of memory blocks, when a number of fail bits that are detected as a result of the fail bit detection operation is smaller than a set number.

2. The semiconductor memory of claim 1, wherein, in the heating mode, the peripheral circuit is configured to apply the heat to the plurality of memory blocks through an electro-thermal annealing (ETA) process.

3. The semiconductor memory of claim 1, wherein, in the heating mode, the peripheral circuit is configured to generate the heat by generating a Gate Induced Drain Leakage (GIDL) current in the plurality of select transistors.

4. The semiconductor memory of claim 1, wherein, in the heating mode, the peripheral circuit is configured to generate the heat by generating hot carriers in the plurality of select transistors.

5. The semiconductor memory of claim 1, further comprising a temperature detection circuit configured to detect an internal temperature of the semiconductor memory and configured to output a temperature signal that corresponds to the detected internal temperature to the control logic.

6. The semiconductor memory of claim 5, wherein the control logic is configured to determine an internal temperature of the semiconductor memory in response to the temperature signal and configured to end the heating mode when it is determined that the determined internal temperature is higher than a set temperature range.

7. The semiconductor memory of claim 1, wherein the control logic is configured to control the peripheral circuit to program free pattern data in the at least one selected memory block before the heating mode.

8. The semiconductor memory of claim 1, wherein the control logic is configured to control the peripheral circuit to operate in the heating mode when the number of fail bits that are detected as the result of the fail bit detection operation is equal to or greater than the set number.

9. A semiconductor memory comprising:
   a plurality of memory blocks each including a plurality of select transistors and a plurality of memory cells;
   a peripheral circuit configured to perform a general operation including a program operation, a read operation, and an erase operation on the plurality of memory blocks or to perform a test program and perform a fail bit detection operation on the plurality of memory blocks; and
   a control logic configured to control the peripheral circuit to operate in a heating mode in which the peripheral circuit applies heat to the plurality of memory blocks before a reflow process,
   wherein the control logic is configured to control the peripheral circuit to program system data in a system block, among the plurality of memory blocks, when a number of fail bits that are detected as a result of the fail bit detection operation is smaller than a set number, and
   wherein, in the heating mode, the peripheral circuit is configured to apply the heat to the plurality of memory blocks through an electro-thermal annealing (ETA) process.

10. The semiconductor memory of claim 9, further comprising a temperature detection circuit configured to detect an internal temperature of the semiconductor memory and configured to output a temperature signal that corresponds to the detected internal temperature to the control logic.

11. The semiconductor memory of claim 10, wherein the control logic is configured to determine an internal temperature of the semiconductor memory in response to the temperature signal and configured to end the heating mode when it is determined that the determined internal temperature is higher than a set temperature range.

12. The semiconductor memory of claim 9, wherein the control logic is configured to control the peripheral circuit to program free pattern data in at least one selected memory block, among the plurality of memory blocks, before the heating mode.

13. The semiconductor memory of claim 9, wherein the control logic is configured to control the peripheral circuit to operate in the heating mode when a number of fail bits that are detected as a result of the fail bit detection operation is equal to or greater than a set number.

14. The semiconductor memory of claim 9, wherein, in the heating mode, the peripheral circuit is configured to generate the heat by generating a Gate Induced Drain Leakage (GIDL) current in the plurality of select transistors.

15. The semiconductor memory of claim 9, wherein, in the heating mode, the peripheral circuit is configured to generate the heat by generating hot carriers in the plurality of select transistors.

16. A method for operating a semiconductor memory, the method comprising:
 programming free pattern data in at least one selected memory block, among a plurality of memory blocks;
 performing a pre-baking operation of applying heat to the plurality of memory blocks through an electro-thermal annealing (ETA) process;
 programming test pattern data in the at least one selected memory block and detecting fail bits; and
 programming system data in a system block, among the plurality of memory blocks, when a number of the detected fail bits is smaller than a set number.

17. The method of claim 16, wherein a reflow process is performed after the system data is programmed.

18. The method of claim 16, wherein, in the pre-baking operation, the heat is generated by generating a Gate Induced Drain Leakage (GIDL) current in a plurality of select transistors that are included in each of the plurality of memory blocks.

19. The method of claim 16, wherein, in the pre-baking operation, the heat is generated by generating hot carriers in a plurality of select transistors that are included in each of the plurality of memory blocks.

20. The method of claim 16, wherein the steps are re-performed, starting from the performing of the pre-baking operation, when the number of the detected fail bits are equal to or greater than the set number.

* * * * *